United States Patent [19]

Sera et al.

[11] Patent Number: 5,733,598
[45] Date of Patent: Mar. 31, 1998

[54] FLEXIBLE WIRING BOARD AND ITS FABRICATION METHOD

[75] Inventors: Naoki Sera, Tsuyama; Toshiharu Fukui, Nara; Kouji Tanabe, Katano; Futoshi Matsui, Tsuyama, all of Japan

[73] Assignee: Matsushita Electric Industrial Co., Ltd., Osaka, Japan

[21] Appl. No.: 815,993

[22] Filed: Mar. 10, 1997

Related U.S. Application Data

[60] Continuation of Ser. No. 463,988, Jun. 5, 1995, abandoned, which is a division of Ser. No. 132,036, Oct. 5, 1993, Pat. No. 5,461,202.

[30] Foreign Application Priority Data

Oct. 5, 1992 [JP] Japan .................. 4-265993
Nov. 30, 1992 [JP] Japan .................. 4-320230

[51] Int. Cl.⁶ .................................................. B05D 5/12
[52] U.S. Cl. .................... 427/96; 427/98; 427/405
[58] Field of Search ........................ 427/96, 98, 282, 427/304, 383.1, 402, 405

[56] References Cited

U.S. PATENT DOCUMENTS

| | | | |
|---|---|---|---|
| 4,182,781 | 1/1980 | Hooper et al. | 427/98 |
| 4,411,980 | 10/1983 | Haney et al. | 427/98 |
| 4,559,357 | 12/1985 | Matsumoto . | |
| 4,569,902 | 2/1986 | Saito | 427/98 |
| 4,670,351 | 6/1987 | Keane et al. | 427/98 |
| 4,734,156 | 3/1988 | Iwasa | 427/98 |
| 4,752,555 | 6/1988 | Takada et al. | 427/98 |
| 4,898,648 | 2/1990 | Cusano | 427/98 |
| 5,132,772 | 7/1992 | Fetty . | |
| 5,235,139 | 8/1993 | Bengston et al. . | |
| 5,294,755 | 3/1994 | Kawakami et al. . | |
| 5,360,946 | 11/1994 | Feger et al. . | |

*Primary Examiner*—Michael Lusignan
*Assistant Examiner*—Brian K. Talbot
*Attorney, Agent, or Firm*—Ratner & Prestia

[57] ABSTRACT

A flexible wiring board includes a printed conductive circuit layer formed on an insulating film, a metallic layer formed on the printed conductive circuit layer, and an insulating layer formed on the metallic layer. A method of making a flexible wiring board includes the steps of forming a conductive circuit layer by screen printing a wiring pattern using a conductive paste, baking the printed wiring pattern, and forming a metallic layer on the printed conductive circuit layer by a plating method.

13 Claims, 10 Drawing Sheets

FLEXIBLE WIRING BOARD AND ITS FABRICATION METHOD

CROSS-REFERENCE TO RELATED APPLICATION

This application is a continuation of application Ser. No. 08/463,988 filed Jun. 5, 1995 now abandoned, which is a division of application Ser. No. 08/132,036, filed Oct. 5, 1993 now U.S. Pat. No. 5,461,202.

BACKGROUND OF THE INVENTION

The present invention relates to a flexible wiring board for use in operating panels of various kinds of electronic equipment and its fabrication method.

One method of the prior art flexible wiring board fabrication is removing unnecessary portions of copper foil by etching from a flexible board on which copper foil is pasted, and leaving circuit portions of the copper foil to form a conductive circuit.

Another method of the prior art flexible wiring board fabrication is by printing a circuit pattern on a flexible board with use of a conductive paste which was prepared by dispersing conductive powders such as a silver powder or the like into resin varnish and baking the printed pattern to complete a conductive circuit layer.

However, in the case of the flexible wiring board that uses copper foil, the disposition of the waste solution released from a etching process is costly and the environmental contamination problems caused by disposing harmful waster solution tend to become serious. Besides, the copper foil raises a question of insufficient durability against bending strains.

In the case of the flexible wiring board that uses a conductive paste to form a printed conductive circuit, there are questions of high resistance of the circuit pattern, inferior quality of the circuit, and poor solderability of the printed conductive circuit.

SUMMARY OF THE INVENTION

The present invention is intended for solving the aforementioned problems, and its object is to provide a flexible wiring board characterized by low resistance wiring circuits, good solderability, excellent durability against bending strains, or the like.

In addition to the foregoing, it aims at offering a method for fabricating flexible wiring boards, which features safety to the environment, low costs, or the like.

The flexible wiring board of the present invention is composed of a printed conductive circuit layer formed at specified places on an insulating film, a metallic layer formed on the printed conductive circuit layer, and an insulating layer formed on the metallic layer.

Also, the method for fabricating a flexible wiring board as disclosed by the present invention comprises the steps of forming wiring patterns at specified places on an insulating film by means of a screen printing using a conductive paste, forming a conductive circuit layer by baking the conductive paste, forming a metallic layer on the printed conductive circuit layer by means of a plating method, and forming an insulating layer on the metallic layer at places excluding at least lands for soldering.

The present invention makes it possible to bring about such effects as low resistance in the circuits, excellent conducting quality, easy soldering to the metallic layer formed on the printed conductive circuit layer, excellent durability against bending strains without causing breakage in the printed conductive circuit layer, no necessity of disposing the harmful waste solution produced from fabrication processes resulting in protection of the environment from contamination and reduced production costs due to simplified fabrication processes, or the like.

Key to Symbol

| | |
|---|---|
| 1, 11, 21, 41, 51, 61, 71, 81 | Insulating Film |
| 2, 15, 22, 42, 52, 62, 72, 82 | Printed Conductive Circuit Layer |
| 3, 19, 24, 43, 73, 83 | Metallic Layer |
| 4, 16, 23, 25, 44, 53, 63, 74, 84 | Insulating Layer |
| 12 | Copper Conductor |
| 28, 37 | Reinforcement Plate |
| 47 | Printed Conductive Layer for Shielding |
| 54 | Printed Adhesive Layer |
| 55 | Printed Release Agent Layer |
| 64a | Soft Reinforcement Material Layer |
| 64b | Hard Reinforcement Material Layer |
| 85 | Material Layer Through Hole |

DETAILED DESCRIPTION OF THE INVENTION

With the help of examples, the present invention is explained in detail.

EXAMPLE 1

Figure 1A:
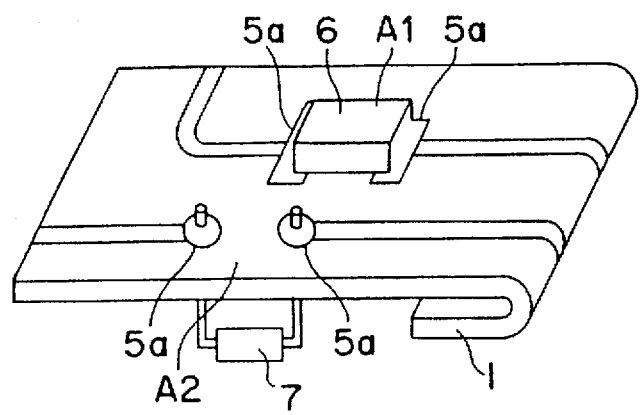
FIG. 1(a) is a perspective view of a flexible wiring board as a first exemplary embodiment of the present invention.
Figure 1B:
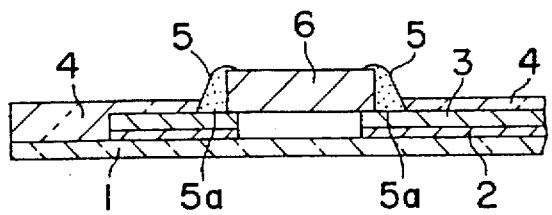
FIG. 1(b) is a cross-sectional view cutting across an important area A1 of the flexible wiring board as shown in FIG. 1(a).
Figure 1C:
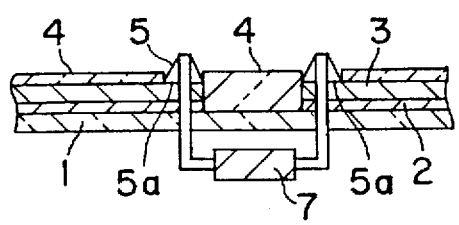
FIG. 1(c) is a cross-sectional view cutting across an important area A2 of the flexible wiring board as shown in FIG. 1(a).

A flexible wiring board is described as a first exemplary embodiment of the present invention with the help of FIG. 1(a) through FIG. 1(c). In FIG. 1(a) to FIG. 1(c), a printed conductive circuit layer 2 and a circuit pattern are disposed on one principal surface of an insulating film 1 by means of a screen printing method or the like. A metallic layer 3 is formed on the printed conductive circuit layer 2 by means of a plating method. An insulating layer 4 is disposed on the metallic layer 3 except it is not disposed on lands for soldering 5a. Solder 5 serves as a connecting means to join a chip component 6 and a leaded component 7 to the lands for soldering 5a formed of the metallic layer 3.

In addition, the insulating layer 4 can also be disposed on the surface of the insulating film 1 where no metallic layer 4 is disposed as well as on metallic layer 3.

The printed conductive circuit layer 2 is formed by means of a printed method using a conductive paste which is prepared by dispersing conductive powders of silver, copper palladium, or the like into resin or the like which has good adhesion to the insulating film 1, and then baking the conductive paste. The resin used is polyester resin, epoxy resin, urethane resin or a modified resin thereof.

The metallic layer 3 is formed of copper, solder, nickel, gold, or the like disposed on the printed conductive circuit layer 2 by means of electroplating or electroless plating. The insulating layer 4 is formed mainly of a resin which has flexibility and good adhesion to the insulating film 1. Such resin is mainly formed of polyvinyl chloride resin, urethane resin, epoxy resin or a modified resin thereof.

The insulating film 1 used is polyimide, polyester, polyetherimide, polyether, etherketone, polysulfone, polyethersulfone, polyphenylene sulfide, or the like. The insulating layer 4 is formed by coating an insulating paste by means of a printed method, but it can also be formed by laminating insulating films. It is also possible to make a flexible wiring board which has the printed conductive circuit layer 2, the metallic layer 3, and the insulating layer 4 disposed not only on one surface of the insulating film 1, but also has them disposed sequentially on the other surface of the insulating film 1. It is further possible to make a flexible wiring board which has additionally a second printed conductive circuit layer, a second metallic layer, and a second insulating layer disposed sequentially on the insulating layer 4. It is still further possible to make a multiple-layer flexible wiring board by having more than one of a flexible wiring board, which has the printed conductive circuit layer 2, the metallic layer 3, and the insulating layer 4 disposed on the insulating layer 1, put together one over the other. As the means of putting the respective flexible wiring boards together, an adhesive or an adhesive sheet can be used. It is also possible to form the metallic layer 3 by means of a metal deposition method or other methods of disposing metallic thin films in addition to the plating method.

EXAMPLE 2

Figure 2A:
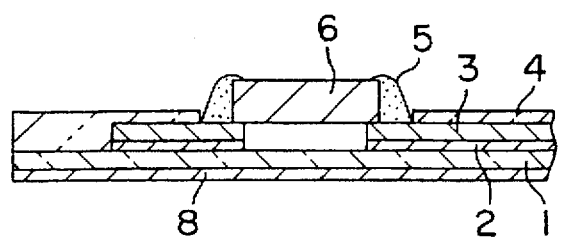
FIG. 2(a) is a cross-sectional view of an important area of a flexible wiring board as a second exemplary embodiment of the present invention.
Figure 2B:
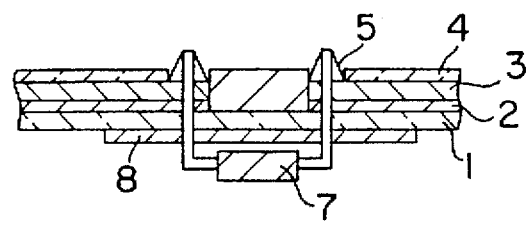
FIG. 2(b) is a cross-sectional view of another important area of the flexible wiring board as the second exemplary embodiment of the present invention.

FIG. 2(a) and FIG. 2(b) illustrate the structure of a flexible wiring board as a second exemplary embodiment of the present invention. The difference of the flexible wiring board as described in FIG. 2 from that of FIG. 1 is in having a reinforcement plate 8 disposed on the bottom surface of the insulating film 1. On account of the reinforcement plate 8, the soldered portions and the vicinity thereof become stronger against the strains caused by bending. A film of polyester such as polyethylene terephthalate or the like, or a plate of aluminum or the like is used as the reinforcement plate 8.

EXAMPLE 3

Figure 3:
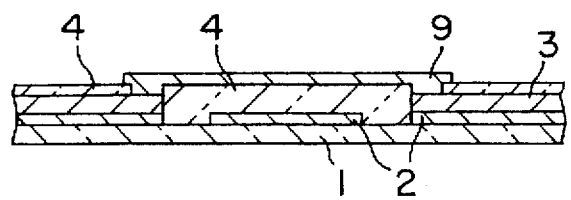
FIG. 3 is a cross-sectional view of a flexible wiring board as a third exemplary embodiment of the present invention.

FIG. 3 shows the structure of a flexible wiring board as a third exemplary embodiment of the present invention. The difference from the flexible wiring board of FIG. 1 is in having a printed conductive circuit layer 9 used as a jumper disposed on the insulating layer 4. The printed conductive circuit layer 9 used as a jumper is formed of a conductive paste which has good adhesion to the metallic layer 3 of the underneath circuit and is similar to the one used in Example 1.

EXAMPLE 4

Figure 4:
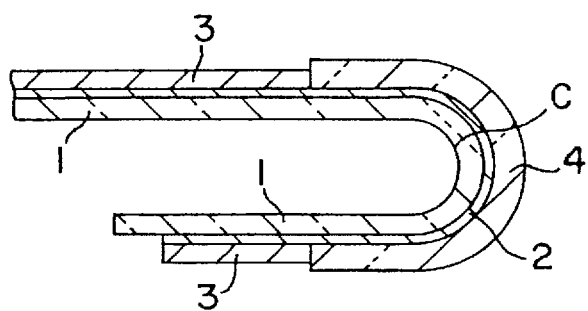
FIG. 4 is a cross-sectional view of a flexible wiring board as a fourth exemplary embodiment of the present invention.

FIG. 4 illustrates the structure of a flexible wiring board as a fourth exemplary embodiment of the present invention. The difference from the flexible wiring board of FIG. 1 is in having no metallic layer 3 disposed along the curved portions of the flexible wiring board of FIG. 4. On account of this structure, a better performance against bending strains can be realized when compared with the flexible wiring board of FIG. 1.

According to Example 1, the insulating layer 4 was formed by means of a printing method. However, the insulating layer 4 can also be formed by laminating insulating films.

According to Example 3, the printed conductive circuit layer 9 for jumper was formed by a conductive paste, but a metallic layer can also be disposed over the printed conductive circuit layer 9 by means of a plating method.

As described in the foregoing, the flexible wiring boards of Example 1 through Example 4 have a structure including a printed conductive circuit layer 2, which excels in adhesion and flexibility, disposed on an insulating film 1, a metallic layer 3 disposed on the printed conductive circuit layer 2 by means of a plating method, and a flexible insulating layer 4 disposed on the surface of the metallic layer 3 except for the soldering lands 5a at a minimum.

On account of the foregoing structure, such features have better flexibility than that of the conductive circuit layer formed by means of a prior art etching method, good solderability due to the metallic layer 3, and circuit resistance as low as that of the conductive circuits formed by means of an etching method can be realized. Besides, there is a benefit in realizing a low cost and making an excellent flexible wiring board by more simplified fabrication processes and by more effective utilization of resources when compared with the etching method.

Next, with the help of FIG. 5(a) through FIG. 20, the exemplary applications of the foregoing flexible wiring boards of the present invention will be explained as Example 5 to Example 19.

EXAMPLE 5

Figure 5A:
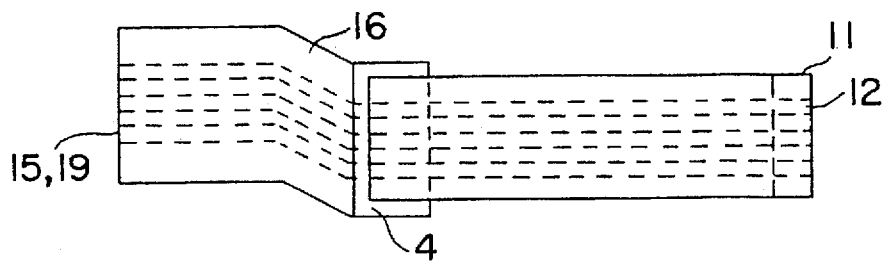
FIG. 5(a) is a top plan view of a flexible wiring board as a fifth exemplary embodiment of the present invention.
Figure 5B:
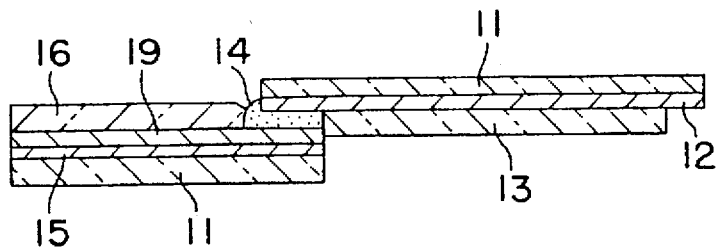
FIG. 5(b) is a cross-sectional view of a flexible wiring board as a fifth exemplary embodiment of the present invention.

FIG. 5(a) and FIG. 5(b) show the structure of a flexible wiring board as a fifth exemplary embodiment of the present invention. As illustrated in the drawings, a printed conductive circuit layer 15 is disposed by patterning on an insulating film 11 by means of a screen printing method or the like. A metallic layer 19 is disposed on the printed conductive circuit layer 15 by means of a plating method. An insulating layer 16 is disposed on the surface of the metallic layer 19 except for the connecting area by a printing method. A soldering area 14 formed on a copper conductor 12, which was formed by an etching method and covered with an insulating film 13 except for soldering area 14, is for connection with the copper conductor 12 by soldering.

Polyimide resin or the like having high thermal resistance is used as the insulating film 13. A copper clad polyimide board, wherein the polyimide insulating film and the copper conductor 12 are put together by lamination, is used as the aforementioned copper conductor 12 covered with the insulating film 13.

Further, the printed conductive circuit layer 15 is formed of a conductive paste which is prepared by dispersing conductive powders of silver, copper, palladium or the like into a resin or the like that shows good adhesion to the insulating film 11. The resin is polyester resin, epoxy resin, urethane resin or a modified resin thereof. The metallic layer 19 is formed of copper, solder, nickel, gold or the like disposed on the printed conductive circuit layer 15 by means of electroplating or electroless plating. The insulating layer 16 is mainly formed from a flexible resin such as polyvinyl chloride resin, urethane resin or epoxy resin, or a modified resin thereof which have good adhesion to the insulating film 1i. The insulating film 11 used is polyimide, polyester, polyetherimide, polyetheretherketone, etherketone, polysulfone, polyethersulfone, polyphenylene sulfide or the like.

EXAMPLE 6

Figure 6:
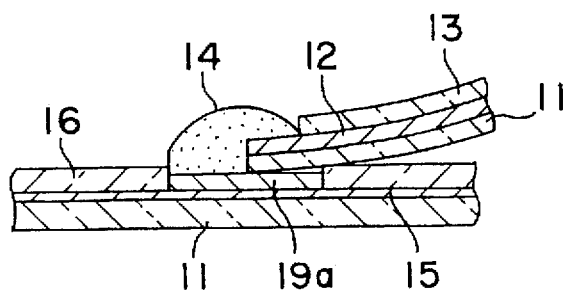
FIG. 6 is a cross-sectional view of a flexible wiring board as a sixth exemplary embodiment of the present invention.

FIG. 6 shows the structure of a flexible wiring board as a sixth exemplary embodiment of the present invention. What differs in the present example from Example 5 shown in FIG. 5(a) and FIG. 5(b) is explained below. A metallic layer 19a is formed only at the connecting area, where a soldering area 14 is located, for securing durability against bending strains.

In the foregoing Example 5 and Example 6, the copper clad polyimide board formed of the copper conductor 12 is connected with the flexible wiring board of the present invention. The copper clad polyimide board having high thermal resistance facilitates is connected with component parts by soldering, and the connecting areas at both sides being metallic make it possible to connect by reliable soldering. This results in enhanced connecting reliability and also elimination of steps such as heat sealing or the like. The metallic layer 9 formed on the printed conductive circuit layer 15 by means of a plating method contributes to a reduction of wiring resistance. Additionally, the copper clad polyimide board is required to be used only at limited places with resultant contribution to realization of low cost and yet excellent flexible wiring boards.

EXAMPLE 7

Figure 7:
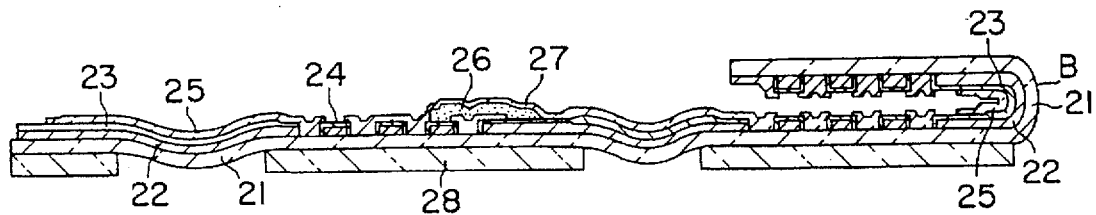
FIG. 7 is a cross-sectional view of a flexible wiring board as a seventh exemplary embodiment of the present invention.

FIG. 7 illustrates the structure of a flexible wiring board as a seventh exemplary embodiment of the present invention. In FIG. 7, a printed conductive circuit layer 22 is disposed on the insulating film 21. A first insulating layer 21 is formed selectively on the printed conductive circuit layer 22 and also on the surface of the insulating film 21 where conductive circuits are not formed. A metallic layer 24 is disposed on the printed conductive circuit layer 22. A second insulating layer is provided. A second printed conductive circuit layer 26 is disposed on the printed conductive circuit layer 22 and metallic layer 24. Another insulating layer 27 is provided. A reinforcement plate 28 is joined by adhesion with the insulating film 21.

More specific aspects of Example 7 are explained here. The printed conductive circuit layer 22 is prepared by screen printing a specified pattern with use of a conductive paste (DX-121H made by TOYOBO) on an insulating film 21 formed of polyester film 75 μm thick, and then by baking at 150° C. for 30 minutes. The insulating layer 23 is disposed by screen printing with use of an insulating resist paste (FC-30G made by SHIKOKIKA-SEI), and then by baking at 150° C. for 30 minutes. The metallic layer 24 formed of copper of 15 μm thick and solder of 5 μm thick, is disposed by means of electroplating. Then, a different printed conductive circuit layer 26 is formed by screen printing in the same way as the printed conductive circuit layer 22 was formed, and then another different insulating layer 27 is formed by screen printing in the same way as the insulating layer 23 was formed to complete a multi-layer wiring structure. The reinforcement plate 28 is an aluminum sheet 1 mm thick.

In addition, the conductive paste for the printed conductive circuit layer 22 can be selected from the conductive pastes which were prepared by dispersing conductive powders of metals such as silver, copper, palladium or the like into resins such as polyester, epoxy, urethane or the modification thereof, all having good adhesion to the insulating film 1. The metallic layer 24 can be formed of a metal selected from copper, solder, nickel, gold, or the like and disposed on the printed conductive circuit layer 22 by means of electroplating or electroless plating. The insulating layers 23, 25 and 27 can be selected from materials which are flexible and mainly formed of rubber resin, vinyl resin, urethane resin, epoxy resin or a modified or mixed resin thereof, all having good adhesion to the insulating film 21. The material for the insulting film 21 can be polymide, polyester, polyetherimide, polyether-etherketone, polysulfone, polyethersulfone, polyphenylenesulfide, or the like.

The foregoing flexible wiring board as explained in Example 7 is characterized by disposing the printed conductive circuit layer 22, which excels in adhesion and flexibility, on the insulating film 21, forming the flexible insulating layer 23 on the area (area B) of the printed conductive circuit layer 22, where good durability against bending strains is required, disposing the metallic layer 24 on the printed conductive circuit layer 22 by means of plating, and forming the flexible insulting layer 25 on the surface of the metallic layer 24 except for the connecting area of the soldering land.

Accordingly, the conductive circuit layer has better flexibility than the one formed by the prior art etching method, and soldering to the metallic layer 24 is made possible. Also, low wiring resistance almost equal to the resistance of the conductive circuit formed by etching can be realized. Further, a low cost and yet excellent flexible wiring board, which can benefit from simpler processes and better utilization of resources when compared with using the etching method, can be realized.

EXAMPLE 8

Figure 8:
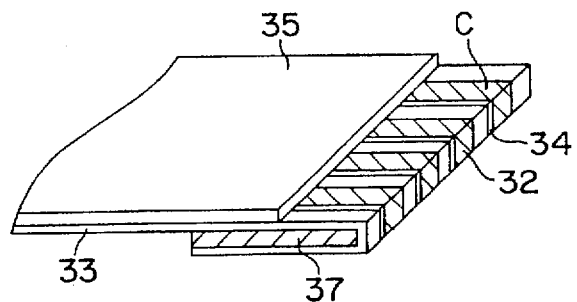
FIG. 8 is a perspective view of a flexible wiring board as an eighth exemplary embodiment of the present invention.

FIG. 8 illustrates the structure of a flexible wiring board as an eighth exemplary embodiment of the present invention. In FIG. 8, a printed conductive circuit 34 is disposed on the insulating film 33, a metallic layer 32 is formed on the printed conductive circuit 34, an insulting layer 35 is provided, and a reinforcement plate 37 is held by squeezing between surfaces of the bent insulating film 33. The printed conductive circuit layer 34 is formed by patterning on the insulating film 33 by means of a screen printing method or the like, the metallic layer 32 is disposed on the printed conductive circuit layer 34 by plating, and the insulating layer 35 is formed on areas except for a connecting terminal C. The reinforcement plate 37 is disposed in the space formed by bending the insulating film 33 to reinforce the connecting terminal C.

In addition, the printed conductive circuit layer 34 is formed of a conductive paste which was prepared by dispersing conductive powders metals such as silver, copper, palladium or the like into resins such as polyester, epoxy, urethane or the modification thereof, all having good adhesion to the insulting film 33. The metallic layer 32 is formed of a metal selected from copper, solder, nickel, gold, or the like and disposed on the printed conductive circuit layer 34 by electroplating or electroless plating. The insulating layer 35 is mainly formed of materials which are flexible and have good adhesion to the insulating film 33, such as vinyl resin, urethane resin, epoxy resin or a modified resin thereof. The materials for the insulating film 33 are polyimide, polyester, polyetherimide, polyether-etherketone, polysulfone, polyethersulfone, polyphenylenesulfide, or the like. The reinforcement plate is a polyester film, a phenol laminated board, a glass epoxy laminated board, an aluminum plate, or the like.

Figure 9:
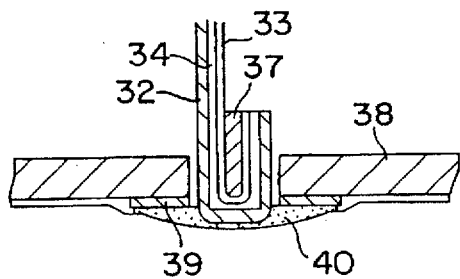
FIG. 9 is a cross-sectional view to show an important area of a specific example wherein the flexible wiring board of the eighth exemplary embodiment of the present invention is used as a connector.

FIG. 9 shows a specific example wherein the terminal end of the flexible wiring board illustrated in FIG. 8 is used as a connecting means, and shows how the terminal end of the flexible wiring board can be soldered to a land 39 of a printed circuit board 38 by solder 40.

EXAMPLE 9

Figure 10A:
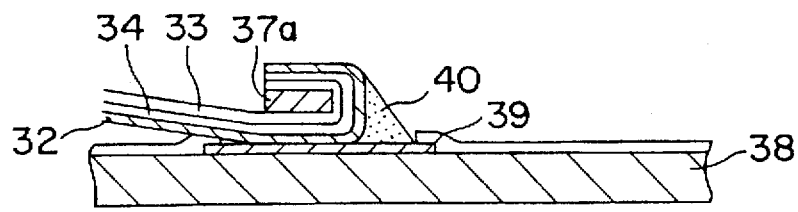
FIG. 10(a) is a cross-sectional view of a flexible wiring board as a ninth exemplary embodiment of the present invention.
Figure 10B:
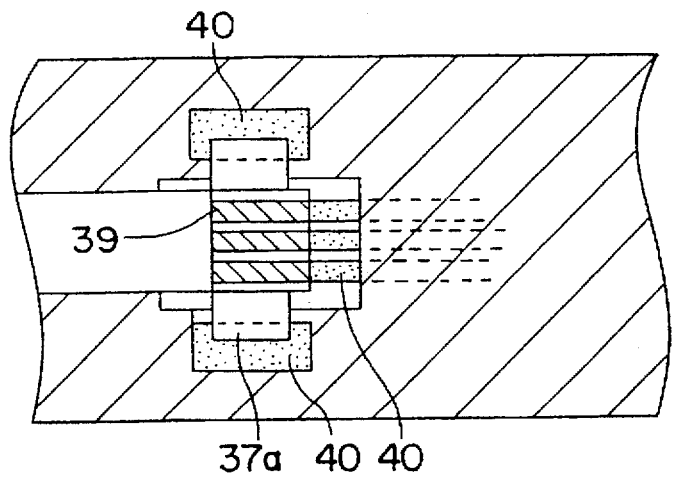
FIG. 10(b) is a top plan view of the flexible wiring board as the ninth exemplary embodiment of the present invention.

A ninth exemplary embodiment of the present invention is explained with the help of FIG. 10(a) and FIG. 10(b). The explanation is made only on the points where Example 9 differs from Example 8. Item 37a is a reinforcement plate formed of a solderable metal such a aluminum, or the like, and the reinforcement plate 37a is also soldered to the land 39 of the printed circuit board 38 by the solder 40 to enhance the connecting strength.

Thus, the flexible wiring boards of Example 8 and Example 9 described in the foregoing have a structure wherein the reinforcement plate 37a is held by the bent connecting terminal C which makes it possible to provide a flexible wiring board which can be easily mounted on a printed circuit board.

EXAMPLE 10

Figure 11:
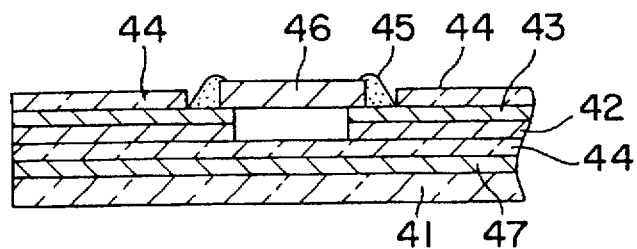
FIG. 11 is a cross-sectional view of a flexible wiring board as a tenth exemplary embodiment of the present invention.

A tenth exemplary embodiment of the present invention is explained with the help of FIG. 11. In FIG. 11, a printed conductive layer 47 for shielding is disposed on a insulating film 41 by means of screen printing or the like, and an insulating layer 44 is further disposed on the printed conductive layer 47 with another printed conductive circuit layer 42 formed by patterning on the insulating layer 44 by means of a screen printing method or the like. Item 43 is a metallic layer disposed on the printed conductive circuit layer 42 by means of plating, and further the insulating layer 44 is disposed on the areas surrounding the soldering land situated on the metallic layer 42. A soldered area 45 fixes a component part 46 by soldering to the land formed of metal.

In addition, the printed conductive circuit layer 42 and the printed conductive circuit layer 47 for shielding are formed of a conductive paste which was prepared by dispersing conductive powders of metals such as silver, copper, palludium or the like into resins such as polyester, epoxy, urethane or a modification thereof, all having good adhesion to the insulating film 41 and insulating layer 44. The metallic layer 43 is formed of a metal selected from copper, solder, nickel, gold, or the like and disposed on the printed conductive circuit layer 42 by means of electroplating or electroless plating.

The insulating layer 44 is mainly formed of materials, which are flexible and have good adhesion to the insulating film 41, such as vinyl resin, urethane resin, epoxy resin or a modified resin thereof.

The insulating film 41 material is polyimide, polyester, polyetherimide, polyetheretherketone, polysulfone, polyethersulfone, polyphenylenesulfide, or the like.

In addition, it is possible to make a flexible wiring board comprising a printed conductive circuit layer 42 disposed on one principal surface of an insulating layer 41, a metallic layer 43 having a soldering land formed on the printed conductive circuit layer 42 by means of plating, an insulating layer 44 disposed on the surface of the metallic layer 43 except for the area where the soldering land is located, a printed conductive layer for shielding disposed on the insulating layer 44, and a second insulating layer formed on the conductive layer for shielding.

EXAMPLE 11

Figure 12:
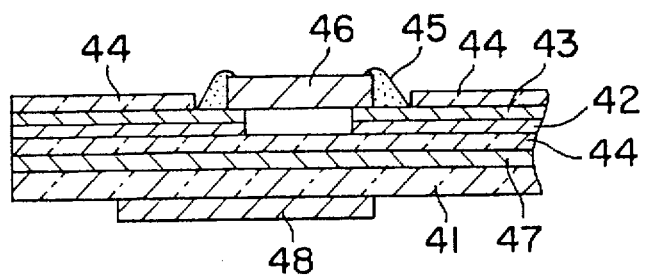
FIG. 12 is a cross-sectional view of a flexible wiring board as an eleventh exemplary embodiment of-the present invention.

FIG. 12 illustrates the structure of a flexible wiring board as an eleventh exemplary embodiment of the present invention, Only the differences between the present example and Example 10 are explained below.

The difference from foregoing Example 10 is that a reinforcement plate 48 is disposed on the bottom surface of the insulating film 41.

The reinforcement plate strengthens the soldered places or the like against bending strains. The reinforcement plate 8 is a polyester film such as ethylene terephthalate or the like, or an aluminum plate or the like.

EXAMPLE 12

Figure 13:
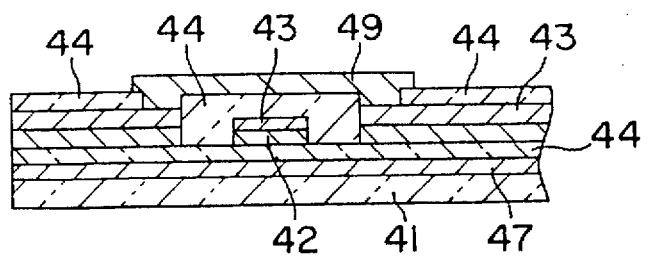
FIG. 13 is a cross-sectional view of a flexible wiring board as a twelfth exemplary embodiment of the present invention.

FIG. 13 illustrates the structure of a flexible wiring board as a twelfth exemplary embodiment of the present invention. Only the differences between the present example and Example 10 are explained below.

The difference from foregoing Example 10 is that a printed conductive circuit layer 48, serving as a jumper crosses over the metallic layer 43, disposed on the insulating layer 44.

EXAMPLE 13

Figure 14:
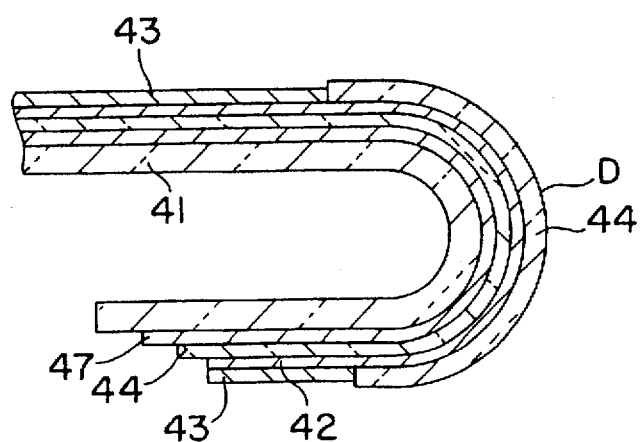
FIG. 14 is a cross-sectional view of a flexible wiring board as a thirteenth exemplary embodiment of the present invention.

FIG. 14 illustrates the structure of a flexible wiring board as a thirteenth exemplary embodiment of the present invention.

Only the difference between the present example and Example 10 are discussed below.

The difference from foregoing Example 10 is that a curved section D is formed as well as a metallic layer 43. Metallic layer 43, is not formed on the curved section D area. This construction ensures excellent durability against bending strains. Metallic layer 43 is formed plating.

EXAMPLE 14

Figure 15:
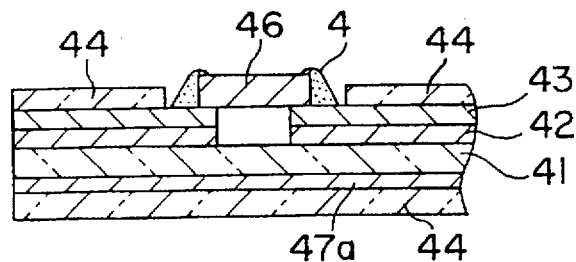
FIG. 15 is a cross-sectional view of a flexible wiring board as a fourteenth exemplary embodiment of the present invention.

FIG. 15 illustrates the structure of a flexible wiring board as a fourteenth exemplary embodiment of the present invention.

The differences between the present example, and Example 10 is provided below.

The difference from Example 10 is that a conductive layer 47a serving as a shield is formed on a surface of the insulating film 41 opposite to the surface where the printed conductive circuit layer 42 is disposed instead of on the same side. An insulating film 44 is also formed on the conductive layer 47a.

The conductive layer 47a may be form by plating.

As described in Example 10 to Example 14, by having the conductive layer 47 or the conductive layer 47a, serving as a shield, it has become possible to provide a flexible wiring board which is low in cost and excellent in shielding effects.

EXAMPLE 15

Figure 16:
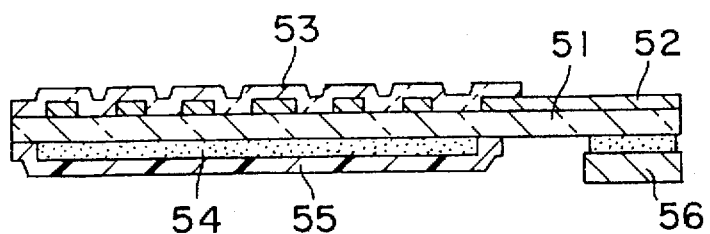
FIG. 16 is a cross-sectional view of a flexible wiring board as a fifteenth exemplary embodiment of the present invention.

A fifteenth exemplary embodiment of the present invention is explained with the help of FIG. 16.

In FIG. 16, a printed conductive circuit layer 52 is disposed on an insulating film 51 with a cover coat insulating layer 53 superimposed on the printed conductive circuit layer 52.

On the bottom surface of the insulating film 51 a printed layer of adhesive material 54 is disposed on the bottom surface of the insulating film 51, a printed layer of mold release material 55 is disposed on the printed layer of adhesive material 54, and a reinforcement plate 56 is attached by adhesion onto the printed layer of adhesive material 54 in the same way.

After screen printing a specified pattern on a polyester insulating film 51 of a work size measuring 500 ×300 mm and a thickness of 75 φm with a conductive paste (DX-121H of TOYOBO), a conductive circuit layer 52 was forced by baking at 150° C. for 30 minutes.

An insulating layer 53 was formed by baking at 150° C. for 30 minutes after screen printing with an insulating resist paste (XB803A of FUJIKURA KASEI).

Then, a screen printing was applied to the bottom surface of the film with the use of an adhesive paste (UPA-046 of FUJIKYRA KASEI) and the printed adhesive was hardened by irradiation of ultra-violet light to form an adhesive material layer 54, and further a screen printing of mold release masking tape (TB-3044 of THREE BOND) was applied and irradiated with ultraviolet light to form a layer of mold release material 55.

After working on the external shape of the flexible wiring board, the layer of mold release material 55 was peeled off, and then a 1 mm thick aluminum plate was attached to the layer of adhesive material 54 to form a reinforcement plate 56.

The adhesive material used in the adhesive material layer 54 of the aforementioned example can be selected according to the required adhesion strength from vinyl resins such as polyvinyl chloride, vinyl acetate, or the like, rubber resins such as chloroprene-rubber, nitrile-rubber, natural rubber, or the like, such other resins as acrylic, polyolefin, urethane, polyester, epoxy and silicone resins, and the copolymer and blend resins thereof.

The equipment for baking is selected from a solvent drying type, a thermosetting type, a UV curing type, or the like according to the required resin baking system.

Any materials can be used for the mold release material 55 provided such materials have an appropriate releasing capability since those materials are secondary in importance to enhance the performance of the flexible wiring boards.

The reinforcement plate 56, can be a soft plate such as a polyester plate, or the like, or a hard plate such as an aluminum plate, or the like.

Generally, in the case of soft plates, a reinforcement plate coated in advance with an adhesive material is placed by adhesion on a flexible wiring board before the board is subjected to machining of its outline configuration, and the flexible wiring board and the reinforcement plate may be together processed by machining the outline configuration thereof.

In place of having the mold release material printed on the reinforcement plate after printing of the adhesive material, the mold release material may be placed by adhesion on the plate.

In the aforementioned example, the adhesive material layer 54 can be disposed on the surface of the insulating layer 53. In this case, the mold release material layer 55 is formed on the insulating layer 51.

Although a flexible wiring board using a printed conductive circuit layer 52 was explained in the foregoing example, the method employed is equally effective wherein the conductive circuit wiring is the most widely used copper foil etched wiring or, a double-sided wiring, or a multiple-layer wiring.

All the foregoing kinds of wiring are, as a matter of coarse, covered by the present invention.

Also, it is possible in the foregoing example to dispose other flexible wiring layers on the adhesive material layer 54 to form a multiple-layer wiring board.

According to the foregoing example, an adhesive material layer and a mold release material layer can be formed together by printing on the upper or bottom surface of a flexible wiring board of a work size for printing, resulting in very efficient production work.

Additionally, there is no loss in materials due to the screen printing of the adhesive material and the mold release material which are in a paste-like state. Also, there is no problem of wrinkles, since process of sheet placing is not involved.

Further, a preparatory processing of the outline shape required of the double-sided adhesive sheet and its molding dies are no longer needed.

Additionally, there is no need in using a connecting part like the double-sided adhesive sheet for multiple molding. This contributes to preventing the adhesive paste from sticking to the molding dies at the time the outline shape processing of the flexible wiring board, and contributes to the elimination of the cleaning process frequently required of the molding dies.

Regardless of the form of the insulation film, a role form or a sheet form, the adhesive material and the mold release material can be, in practice, disposed by a continuous printing process with the respective printing machines interconnected, making it possible to enhance the productivity and to prevent the troubles caused by the stickiness of the adhesive material.

EXAMPLE 16

Figure 17:
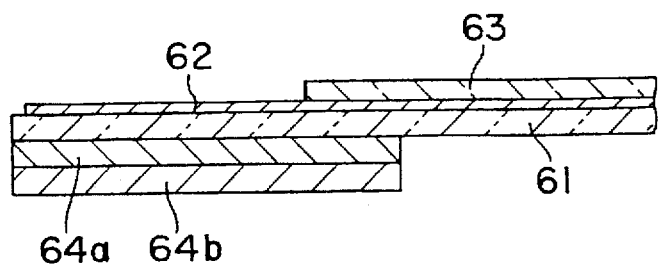
FIG. 17 is a cross-sectional view of a flexible wiring board as a sixteenth exemplary embodiment of the present invention.

FIG. 17 illustrates the structure of a flexible wiring board as a sixteenth exemplary embodiment of the present invention.

In FIG. 17, a printed conductive circuit layer 62 is disposed on a insulating film 61. An insulating layer 63 is formed on the printed conductive circuit layer 62 so that the end part of the printed conductive circuit layer 62 is left uncovered.

The exposed portion of the foregoing printed conductive circuit layer 62 may be disposed with a metallic layer by means of plating.

A soft reinforcement material layer 64a is disposed on the end part of the bottom surface of the insulating film 61.

A hard reinforcement material layer 64b is disposed on the soft reinforcement material layer 64a.

A connected terminal is disposed on the end of on the flexible wiring board.

Example 16 is described is detail below.

After screen printing a specified pattern on a polyester insulating film 61 of a work size measuring 500 ×300 mm and a thickness of 75 µv using a conductive paste (DX-121H of TOYOBO), a conductive circuit layer 62 was formed by baking at 150° C. for 30 minutes. An insulating layer 63 was formed by baking at 150° C. for 30 minutes after screen printing with an insulating resist paste (XB-803A of FUJIKURA KASEI). Then, a screen printing was applied to the end part of the bottom surface of the film with use of a soft reinforcement material paste (P-170 of CEMEDYNE/ isophorone as diluting solvent, 5 wt. %), and the reinforcement material paste was hardened at 150° C. for 30 minutes to complete the soft reinforcement material layer 64a. On the soft reinforcement material layer 64a was superimposed by screen printing a hard reinforcement material paste (47.5 wt. % of EP-170 of CEMEDYNE/47.5 wt. % of EP-171 of CEMEDYNE/5 wt. % of isophorone as diluting solvent), and then the reinforcement material paste was hardened at 150° C. for 30 minutes to complete the hard reinforcement material layer 64b. The combined thickness of the soft reinforcement material layer 64a and the hard reinforcement material layer 64b was 200 µm.

A connector engagement and disengagement test was conducted both on the flexible wiring board of the present example and a prior art flexible wiring board having a reinforcement plate of a 180 µm thick polyethylene terephthalate film covered by a 20 µm thick adhesive material attached by adhesion. According to the test result, while the printed conductive circuit layer 62 of the prior art flexible wiring board was worn out after 20 times of the engagement and disengagement of a connector, the printed conductive circuit layer 62 of the flexible wiring board disposed with the reinforcement layers 64a and 64b according to the foregoing example was worn out after 50 times of the engagement and disengagement of the connector.

The reinforcement material can be selected according to the required strength from vinyl resins such as polyvinylchloride or the like, rubber resins such as chloroprenerubber, nitrile-rubber, natural rubber or the like, such other resins as acrylic, polyolefin, urethane, polyester, epoxy and silicone resins or the like, the copolymer resins thereof, or the blend resins thereof.

Although a flexible wiring board using a printed conductive circuit layer 62 was explained in the foregoing example, the method employed is equally effective where the conductive circuit wiring is the most widely used copper foil etched wiring, a double-sided wiring, or a multiple-layer wiring. All of the foregoing kinds of wiring are, as a matter of course, covered by the present invention.

According to the foregoing example, numerous reinforcement material layers 64a and 64b can be formed together by printing at specified areas of a flexible wiring board of a work size for printing, resulting in very efficient production work.

Additionally, there is no loss in materials due to screen printing of the reinforcement material which is in a paste-like state. There is no problem of wrinkles either, since no process of sheet placing is involved. Further, coating of the adhesive material on the reinforcement sheet, preparatory processing of the outline shape and its molding dies are no longer needed. Therefore, there is no danger of the adhesive paste sticking to the molding dies during the outline shape processing of the flexible wiring board, and therefore no need for the frequent cleaning of the molding dies which was required before.

Further, the durability of the end part of the printed conductive circuit layer against the connector's engagement and disengagement operation is greatly enhanced when the reinforcement material layer is composed of two printed layers, first printed with a soft material and second with a hard material.

EXAMPLE 17

Figure 18:
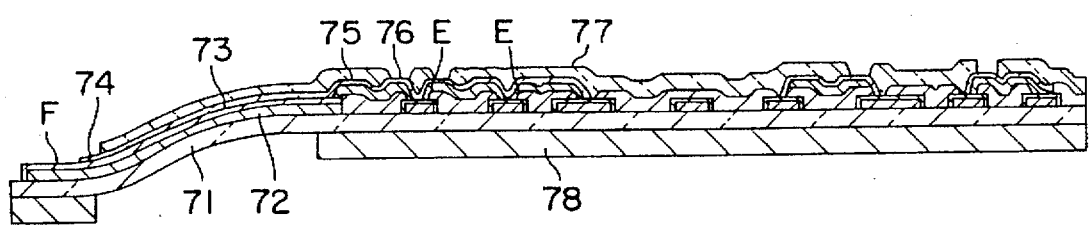
FIG. 18 is a cross-sectional view of a flexible wiring board as a seventeenth exemplary embodiment of the present invention.

FIG. 18 illustrates the structure of a flexible wiring board as a seventeenth exemplary embodiment of the present invention. In FIG. 18, a first printed conductive circuit layer 72 is formed on the insulating film 71 by screen printing with the use of a conductive paste. A first metallic layer 73 is disposed on the conductive circuit layer 72 by means of a plating method. A first flexible insulating layer 74 is disposed by screen printing with use of an insulating paste on the surface of the first metallic layer 73 except for the areas where a through-hole land E and an external connection terminal F are located and on the insulating film 71. On the insulating layer 74 is, disposed by screen printing with use of a conductive paste, a printed conductive circuit layer 75 which is connected with the through-hole land E. On the conductive circuit layer 75 is formed by means of a plating method a second metallic layer 76. A second insulating layer 77 is disposed by screen printing on the second metallic layer 76 except for the area where the external connection terminal F is located. Further, a reinforcement plate 78 is disposed on the bottom surface of the insulating film 71. Accordingly, the flexible wiring board of the present example is fabricated by the steps of forming by patterning the insulating layer 74 on the first metallic layer 73 and on insulating film 71 with the through-hole land E exposed without being covered by the insulating layer 74, disposing the printed conductive circuit layer 75 to connect with the through-hole land E, and further forming the second metallic layer 76 on the printed conductive circuit layer 75.

Details of the foregoing example are explained below. After screen printing with use of a silver paste (DX-121H of TOYOBO), conductive circuit layers 72 and 75 were formed by baking at 150° C. for 30 minutes. The conductive paste for the printed conductive circuit layers 72 and 75, can also be formed by a conductive paste prepared by dispersing conductive powders of metals such as silver, copper, palladium or the like into polyester resin, epoxy resin, urethane resin, the modified resins thereof or the like, all having good adhesion to the insulating film or the insulating layer 77. The metallic layers 73 and 76 are composed of metals such as copper, solder nickel, gold or the like that were disposed on the printed conductive circuit layer 72 by means of electroplating or electroless plating.

In the foregoing example, the metallic layer 73 was formed of copper to a thickness of 15 µm by electroplating. The second metallic layer 76 was formed of copper to a thickness of 10 µm, and of solder to a thickness of 5 µm thereon, both by electroplating. The insulating layers 74 and 77 were formed by screen printing with use of a flexible insulating ink (FC-30G of SHIKOKU KASEI), and then by baking at 150° C. for 30 minutes. These insulating layers 74 and 77 are flexible and principally composed of rubber resins, vinyl resins, urethane resins, epoxy resins, the modified resins thereof, or the blend resins thereof, all having good adhesion to the insulating film 71, and the metallic layers 73 and 76. The material for the insulating film 41 can also be polyimide, polyester, polyetherimide, polyetheretherketone, polysulfone, polyphenylenesulfide, or the like.

In the foregoing Example 17, it is also possible to fabricate a multiple-layer circuit by first disposing a third printed conductive circuit layer on the insulating layer 77 in connection with the other metallic layer 76 formed on the through-hole land E, and then disposing a third metallic layer on the third printed conductive circuit layer by means of a plating method.

According to the foregoing example, it is possible to provide a multiple-layer flexible wiring board which is characterized by such excellent effects as the conductive circuit layer having more excellent flexibility than that formed by the prior art etching method, the metallic layer 73 which is solderable, realization of wiring resistance that is as low as the wiring resistance of the conductive circuit formed by etching, a much more simplified fabrication process when compared with the fabrication process using an etching method, the more effective utilization of the resources, and realization of reduction in costs.

EXAMPLE 18

FIG. 19(a) to FIG. 19(h) illustrate the fabrication processes of a flexible wiring board of the present invention. The flexible wiring board illustrated is a double-sided type. In the illustrations, the different layers are an insulating film 81, a printed conductive circuit layer 82, a metallic layer 83, an insulating layer 84, and a through-hole 85. An explanation on each respective step of the fabrication processes follows. FIG. 19(a) shows the step of pattern forming the printed conductive circuit layer 82 at specified places on one principal surface of the insulating film 81 by means of a screen printing method using a conductive paste. FIG. 19(b) is the step of baking the conductive paste printed on the insulation film 81. FIG. 19(c) is the step of disposing by patterning a printed conductive circuit layer 82a on the other surface of the insulating film 81 by means of a screen printing method using a conductive paste. FIG. 19(d) is the step of baking the printed conductive paste. FIG. 19(e) is the step of boring the through-holes 85 at specified areas on the insulating film on which the printed conductive circuit layer is disposed. FIG. 19(f) is the step of forming a conductive circuit layer 82b by applying a conductive paste to the through-holes 85, and then by baking the conductive paste. FIG. 19(g) is the step of disposing the metallic layer 83 on the conductive circuit layers 82, 82a and 82b by plating. FIG. 19(h) is the step of forming the insulating layer 84 on the surface of the metallic layer 83 except for the connecting areas of the soldering lands, and also on the surface of the insulating film 81 where no metallic layer is disposed.

In addition, it is possible to apply, by printing in the foregoing fabrication processes, the conductive paste to both surfaces of the insulating film 81, and then baking the conductive paste.

The printed conductive circuit layers 82, 82a and 82b are formed of a conductive paste prepared by dispersing conductive powders of metals such as silver, copper, palladium or the like into polyester resin, epoxy resin, urethane resin, the modified resins thereof or the like, all having good adhesion to the insulating film 81. The metallic layer 83 is composed of metals such as copper, solder, nickel, gold or the like that are disposed on the printed conductive circuit layer 82 by means of electroplating or electroless plating.

The insulating layer 84 is principally composed of vinyl chloride resin, urethane resin, epoxy resin, the modified resins thereof, all of which have flexibility and good adhesion to the insulating film 81. The material for the insulating film 81 is polyimide, polyester, polyetherimide, polyetheretherketone, polysulfone, polyethersulfone, polyphenylenesulfide, or the like.

EXAMPLE 19

Figure 19:
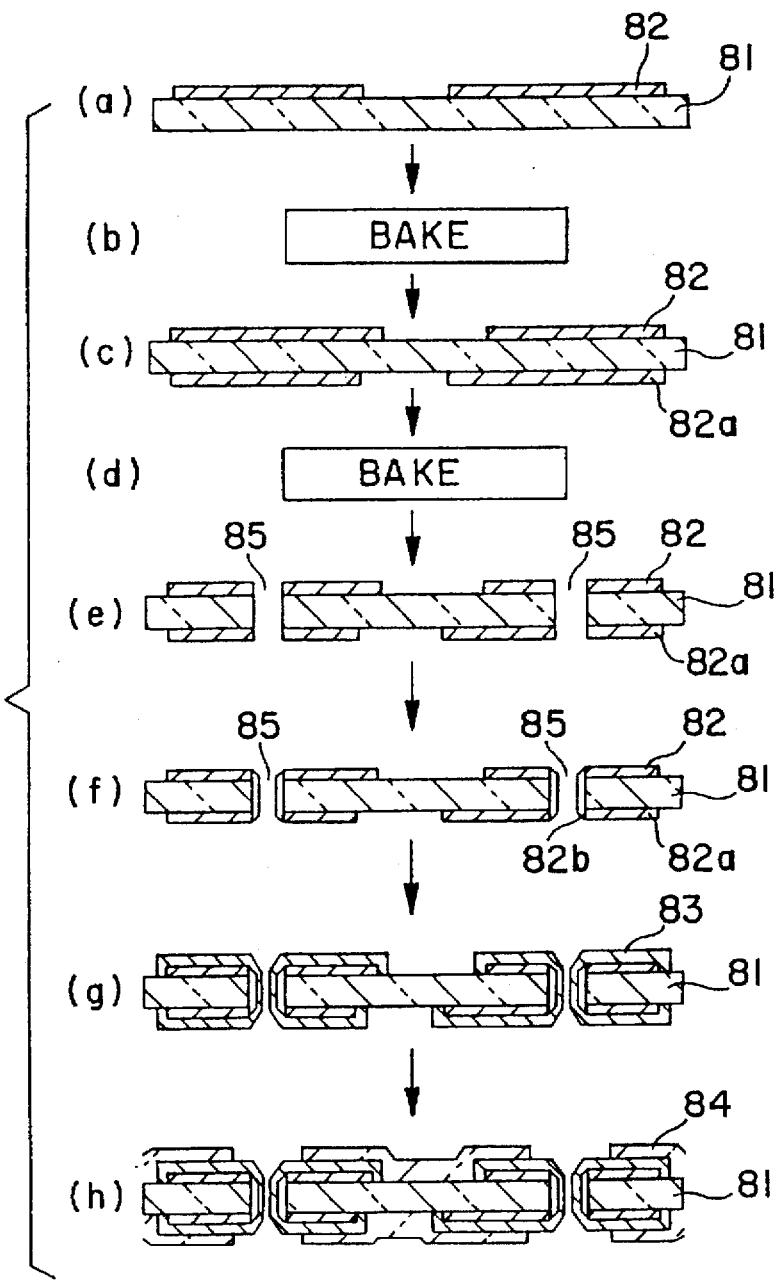
FIG. 19 shows the fabrication process for a flexible wiring board as an eighteenth exemplary embodiment of the present invention.
Figure 20:
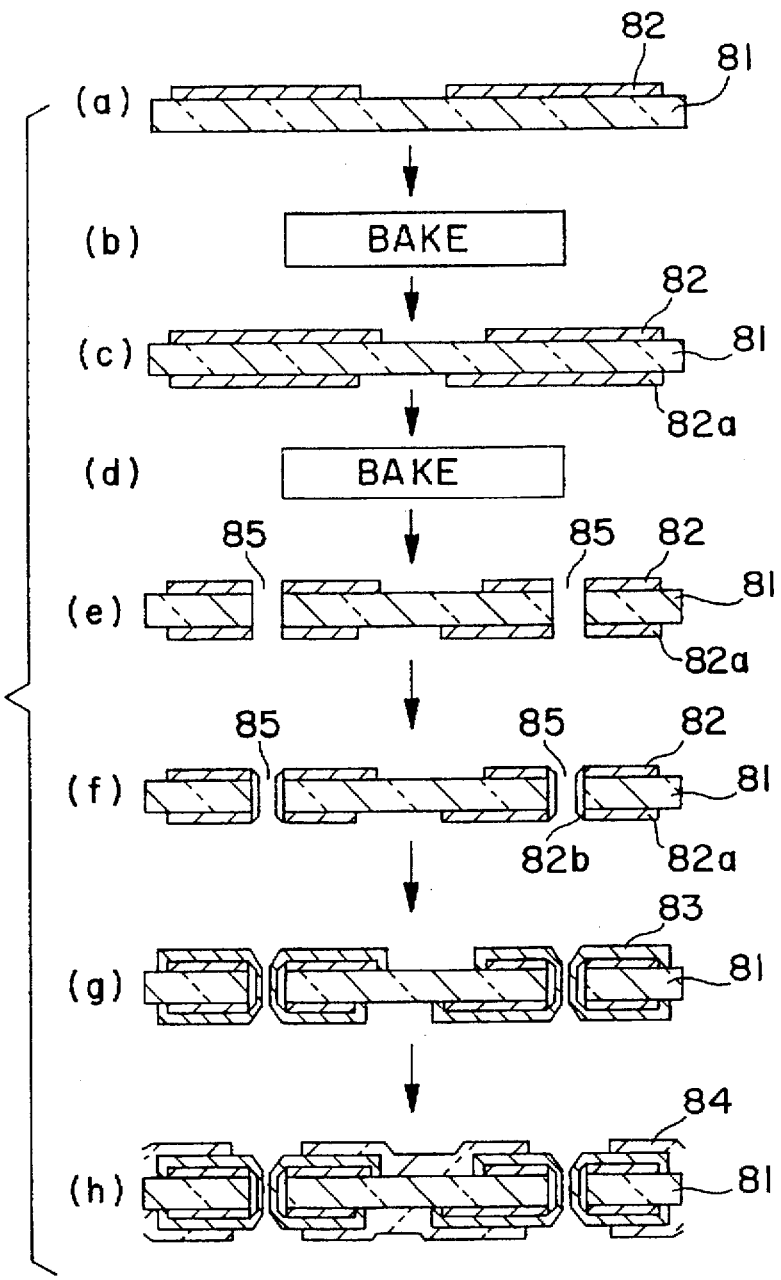
FIG. 20 shows the fabrication process for a flexible wiring board as a nineteenth exemplary embodiment of the present invention.

FIG. 20(a) to FIG. 20(g) illustrate the fabrication processes of a flexible wiring board as a nineteenth exemplary embodiment of the present invention. In the illustrations, the same portions as illustrated in FIG. 19 are referred to by the same numerical symbols as used in FIG. 19. FIG. 20(a) shows the step of boring the through-holes 85 at specified areas on the insulating film 81. FIG. 20(b) shows the step of pattern forming the printed conductive circuit layer 82 on one principal surface of the insulating film 81, where the through-holes 85 are located, by means of a screen printing method using a conductive paste. FIG. 20(c) is the step of baking the conductive paste printed on the insulation film 81. FIG. 20(d) is the step of disposing by patterning a printed conductive circuit layer 82a on the other surface of the insulating film 81 by means of a screen printing method using a conductive paste. FIG. 20(e) is the step of baking the printed conductive paste. FIG. 20(f) is the step of disposing the metallic layer 83 on the conductive circuit layers 82 and 82a by plating. FIG. 20(g) is the step of forming the insulating layer 84 on the surface of the metallic layer 83 except for the soldering lands.

The insulating layer 84 can be disposed not only on the surface of the metallic layer 83, but also on the surface of the insulating film 81 where no metallic layer 83 is disposed.

In the steps for conductive paste printing as illustrated in FIG. 20(b) and FIG. 20(d), the conductive paste is printed on the surfaces of the through-holes 85, too. Accordingly, through-holes having conductivity have been fabricated.

In addition, a reinforcement plate formed of a polyester film, a phenolic laminated board, a metallic plate, or the like can also be disposed at a place where reinforcement is required. By disposing another printed conductive circuit layer on the insulating layer, it is also made possible to fabricate a double sided flexible wiring board of multiple layer circuits.

According to the foregoing Examples 18 and 19, the method of fabrication of a flexible wiring board of the present invention comprises the steps of forming a printed conductive circuit layer 82, which excels in adhesion and flexibility, on an insulating layer 81 by means of a screen printing method of excellent mass-producibility, forming a metallic layer 83 on the printed conductive circuit layer 82 by plating, and disposing a flexible insulating layer 84 on the metallic layer 83 except for the connecting areas of soldering lands.

The fabrication method as disclosed by the present invention makes it possible to realize an excellent flexible wiring board which is characterized by such features as a conductive circuit layer with more excellent flexibility than the one formed by the prior art etching method, a metallic layer 83 which is solderable, realization of wiring resistance that is as low as the wiring resistance of a conductive circuit formed by etching, a much simplified fabrication process when compared with the fabrication method of an etching method, more effective utilization of the resources, reduced costs, or the like.

According to the present invention, it is also possible to use a method of coating an insulating paste and baking it or a method of laminating insulating films by adhesion as the method of forming an insulating layer.

As described in the foregoing, the present invention provides such effects as securing excellent conductivity with reduced wiring resistance by forming a metallic layer on a printed conductive layer formed by means of a printing method using a conductive paste, providing a metallic layer which is readily solderable, assuring environmental safety with no necessity of the disposition of waste solution associated with the prior art etching method using copper foils, realization of reduced costs on account of simplified fabrication processes, or the like.

Accordingly, the prior art flexible wiring board which used copper foils for the conductive circuit layer would break after being bent several times. In contrast, a flexible wiring board of the present invention having a printed conductive circuit layer, has good durability against bending strains as indicated by an experiment wherein the printed conductive circuit layer does not show any breakage even if the metallic layer is broken.

What is claimed:

1. A fabrication method for flexible wiring boards comprising the steps of:
   (a) forming a printed conductive circuit layer on a flexible insulating film,
   (b) plating a metallic layer on said printed conductive circuit layer,
   (c) forming an insulating layer on a portion of said insulating film and on at least a portion of said metallic layer; and
   (d) obtaining said flexible wiring board as a result of steps (a), (b), and (c).

2. A fabrication method for flexible wiring boards according to claim 1, wherein the insulating layer is formed by a printing method using an insulating paste.

3. A fabrication method according to claim 1, wherein the insulating layer is a substrate.

4. A fabrication method for flexible wiring boards according to claim 1, wherein the insulating layer is formed by a laminating method using insulating materials.

5. A fabrication method for flexible wiring boards according to claim 1, wherein said insulating layer is formed mainly of a resin which has flexibility.

6. A fabrication method for flexible wiring boards according to claim 1, wherein said printed conductive circuit layer is formed using a conductive paste which is comprised of dispersing conductive powders and resin.

7. A fabrication method for flexible wiring boards according to claim 1, wherein said first metallic layer is at least one selected from the group consisting of copper, solder, nickel and gold.

8. A fabrication method for flexible wiring boards according to claim 1, wherein said flexible insulating film is a plastic film.

9. A fabrication method for flexible wiring boards according to claim 1, wherein said flexible insulating film is a resin.

10. A fabrication method for flexible wiring boards comprising the steps of:
    (a) screen printing a specified wiring pattern on a first portion of a flexible insulating film using a conductive paste;
    (b) forming a printed conductive circuit layer by baking said wiring pattern;
    (c) plating a metallic layer on said printed conductive circuit layer;
    (d) forming an insulating layer using a printing method on a second portion of said insulating film and on at least a first portion of said metallic layer; and
    (e) obtaining said flexible wiring board as a result of steps (a), (b), (c), and (d).

11. A fabrication method according to claim 10, wherein the insulating layer is a substrate.

12. A fabrication method for flexible wiring boards comprising the steps of:
    (a) screen printing a specified wiring pattern on a first portion of a flexible insulating film using a conductive paste;
    (b) forming a first printed conductive circuit layer by baking said wiring pattern;
    (c) plating a first metallic layer having a plurality of through-hole lands and external connection terminals on said first printed conductive circuit layer;
    (d) forming an insulating layer on said first metallic layer so that said through-hole lands are exposed;
    (e) screen priming a second printed conductive circuit layer on said insulating layer and in contact with said through-hole lands on said first metallic layer;
    (f) plating a second metallic layer on said second printed conductive circuit layer; and
    (g) obtaining said flexible wiring board as a result of steps (a) through (f).

13. A fabrication method according to claim 12, wherein the insulating layer is a substrate.

* * * * *

UNITED STATES PATENT AND TRADE MARK OFFICE
CERTIFICATE OF CORRECTION

PATENT NO. : 5,733,598
DATED : March 31, 1998
INVENTOR(S) : Sera et al.

It is certified that error appears in the above-identified patent and that said Letters Patent is hereby corrected as shown below:

Cover page, item [56] References Cited, U.S. Patent Documents,
 "4,559,357 12/1985 Matsumoto" should be --4,550,357 10/85 Matsumoto--.

Column 16, line 57, "priming" should be --printing--.

Signed and Sealed this

Tenth Day of November 1998

*Attest:*

BRUCE LEHMAN

*Attesting Officer*   *Commissioner of Patents and Trademarks*